United States Patent [19]

Nojima et al.

[11] Patent Number: 5,041,880
[45] Date of Patent: Aug. 20, 1991

[54] LOGIC DEVICE AND MEMORY DEVICE USING CERAMIC SUPERCONDUCTING ELEMENT

[75] Inventors: Hideo Nojima, Nara; Shoei Katoaka, Tanashi; Nobuo Hashizume, Nara; Shuhei Tsuchimoto, Kitakatsuragi; Michitada Morisue, Yono, all of Japan

[73] Assignees: Sharp Kabushiki Kaisha, Osaka; Michitada Morisue, 971-5, Kamiochiai, Yono-shi, Saitama-ken, all of Japan.

[21] Appl. No.: 365,921

[22] Filed: Jun. 14, 1989

[30] Foreign Application Priority Data

Jun. 16, 1988 [JP] Japan .................................. 63-148576
Jun. 16, 1988 [JP] Japan .................................. 63-148577

[51] Int. Cl.$^5$ ...................... H01L 39/22; H01L 27/22
[52] U.S. Cl. .......................................... 357/5; 357/27; 307/306; 365/160; 505/1
[58] Field of Search ...................... 357/2, 27; 307/277, 307/306, 476; 365/160, 161, 162; 505/1, 825, 874

[56] References Cited

U.S. PATENT DOCUMENTS

| 3,093,754 | 7/1963 | Mann .................................. 307/306 |
| 3,196,408 | 7/1965 | Brennemann et al. .............. 307/306 |
| 3,281,609 | 10/1966 | Rowell .................................. 357/5 |
| 3,758,795 | 9/1973 | Anacker et al. ..................... 357/5 |
| 4,371,796 | 2/1983 | Takada .................................. 357/5 |

FOREIGN PATENT DOCUMENTS 60-65582 4/1985 Japan .
64-64377 3/1989 Japan .................................. 307/306

64-89479 7/1989 Japan .................................. 357/5

OTHER PUBLICATIONS

Nojima et al., "Galvanomagnetic Effect . . . ", in *Japanese Journal of Applied Physics*, vol. 27, #5, May 1988, pp. 74-78.
Kita et al., "Highly Sensitive Magnetic", in *5th International Workshop*, Jun. 2-4, 1988, pp. 231-234.
Tsuchimoto et al., "Novel Magnetic Sensor . . . ", in *IEDM*87, Dec. 8, 1987, pp. 867-868.
IBM J. Res., vol. 24, No. 2, Mar. 1980, pp. 113-129.
IBM J. Res., vol. 24, No. 2, Mar. 1980, pp. 143-154.
IBM J. Res., vol. 24, No. 2, Mar. 1980, pp. 155-166.

*Primary Examiner*—J. Carroll

[57] ABSTRACT

A logic device includes a ceramic superconducting element having magneto-resistive characteristics, and three electrodes provided adjacent the ceramic superconducting element, and constructed in such a manner that a current is applied to one of the three electrode so that a magnetic field greater than a threshold magnetic field is normally applied to the ceramic superconducting element, and the other electrodes are used for increasing and decreasing the magnetic field. A memory device includes a superconducting loop at least one portion thereof being formed by a ceramic superconducting element having grain boundaries, and an electrode provided in approximation to said ceramic superconducting element, whereby a current flowing through a portion of said superconducting loop which is other than said ceramic superconducting element can be captured in said superconducting loop by a control of a magnetic field generated by the current flowing through said electrode.

12 Claims, 8 Drawing Sheets

LOGIC DEVICE AND MEMORY DEVICE USING CERAMIC SUPERCONDUCTING ELEMENT

BACKGROUND OF THE INVENTION

1. Field of the Invention

The present invention relates to a device employing a ceramic superconducting element and, more particularly, to an improvement of a logic device and memory device which are controlled by the magneto-resistive characteristics of a ceramic superconducting device by the magnetic field change effecting to the superconducting element.

2. Description of the Prior Art

It is known to use the Josephson effect to theoretically form a logic circuit such as an AND gate. Josephson device is one of well-known logic devices which use the characteristics of superconductors. The logic device utilizing the Josephson effect, herein referred to as a Josephson device, according to prior art has a structure that an extremely thin insulation film is sandwiched between layers made of superconducting materials, such as niobium, lead, or their alloys.

The insulation film in a Josephson device of the above type requires a thickness on the order of ten angstroms. Production of such a thin insulation film, however, requires advanced thin film manufacturing technologies, and actual production is difficult. In addition, although one technical advantage of the Josephson device is its extremely fast operating speed, the output level change is very small. Thus, the Josephson device is not applicable to logic circuits from a practical viewpoint.

In view of the above, a ceramic superconducting element's new phenomenon has been found and is disclosed in detail in prior Japanese Patent applications No. 62-233369 et seq (corresponding to U.S. application Ser. No. 226,067 filed July 29, 1988, and to E.P. application No. 88307044.3 filed July 29, 1988), which is assigned to SHARP KABUSHIKI KAISHA, one of the co-assignee of the present application. When the ceramic superconducting element utilizing the new phenomenon is employed in a logic circuit, such as in an AND, OR, XOR (exclusive or), or NOT (inverter) gate, such a logic circuit shows a stable operation and can be manufactured at a high yield rate, as disclosed in Japanese Patent application No. 63-117472 (corresponding to U.S. application Ser. No. 289,312 filed Dec. 23, 1988, to E.P. application No. 88312296.2 filed Dec. 23, 1988, and to Chinese application No. 88109265.7 filed Dec. 24, 1988), and in Japanese Patent application No. 63-29526 (corresponding to U.S. application Ser. No. 309,228 filed Feb. 10, 1989, to E.P. application No. 89301279.9 filed Feb. 10, 1989, and to Chinese application (application number not yet received)) which are also assigned to SHARP KABUSHIKI KAISHA, one of the co-assignee of the present application.

Although these applications teach the use of the ceramic superconducting element in a logic circuit, such as in an AND, OR, XOR (exclusive or), or NOT (inverter) gate, none of these teaches or suggests the use of the same in a logic circuit which can perform the IMPLICATION or EQUIVALENCE gate operation. The following Tables A and B show the IMPLICATION and EQUIVALENCE logics when they are expressed by the truth table.

TABLE A

IMPLICATION Truth Table

| Input | | Output |
|---|---|---|
| 0 | 0 | 1 |
| 1 | 0 | 0 |
| 0 | 1 | 1 |
| 1 | 1 | 1 |

TABLE B

EQUIVALENCE Truth Table

| Input | | Output |
|---|---|---|
| 0 | 0 | 1 |
| 1 | 0 | 0 |
| 0 | 1 | 0 |
| 1 | 1 | 1 |

Also, these applications do not teach or suggest the use of the ceramic superconducting element in a memory device.

Furthermore, Josephson devices have been conventionally used for storing data by utilizing the characteristics of superconductivity. In such devices, the presence or absence of fluxoid quantum traveling through a loop connected to the Josephson device was correlated to storage states "1" and "0."

However, the structure of Josephson devices such as those used in conventional superconducting memory devices is typically layered, specifically one in which a thin film insulation layer is sandwiched between superconductor layers of niobium, lead, alloys thereof, or other materials.

In a Josephson device as described above, the interposed insulation film must be formed on the order of ten angstroms in order to achieve the tunnel effect enabling superconductivity. That production of such a thin insulation film, however, requires advanced thin film manufacturing technologies and actual production is difficult, that the output level is low, and that use is only possible at very low temperatures has prevented the practical application of such devices.

SUMMARY OF THE INVENTION

The present invention has been developed in consideration of the above described points and has for its essential object to provide an improved logic device employing the ceramic superconducting element which can perform the IMPLICATION or EQUIVALENCE gate operation.

It is also an object of the present invention to provide an improved memory device employing the ceramic superconducting element.

In accomplishing these and other objects, according to the present invention, an IMPLICATION logic device comprises: a substrate; a ceramic superconducting element having magneto-resistive characteristics deposited on the substrate; first electrode located adjacent the ceramic superconducting element for providing a first magnetic field to the ceramic superconducting element when a first electric current is applied therethrough; second electrode located adjacent the ceramic superconducting element for providing a second magnetic field to the ceramic superconducting element when a second electric current is applied therethrough; third electrode located adjacent the ceramic superconducting element for providing a third magnetic field to the ceramic superconducting element when a third electric current is applied therethrough; whereby when the first magnetic field is present, the ceramic superconducting element is made to establish a magneto-resistive state, when the first and second magnetic fields are present, the ceramic superconducting element is made to establish a superconductive state, when the first and third magnetic fields are present, the ceramic superconducting element is made to establish the magneto-resistive state, and when the first, second and third magnetic fields are present, the ceramic superconducting element is made to establish the magneto-resistive state.

Also, according to the present invention, an EQUIVALENCE logic device comprises: a substrate; a ceramic superconducting element having magneto-resistive characteristics deposited on the substrate; first electrode located adjacent the ceramic superconducting element for providing a first magnetic field to the ceramic superconducting element when a first electric current is applied therethrough; second electrode located adjacent the ceramic superconducting element for providing a second magnetic field to the ceramic superconducting element when a second electric current is applied therethrough; third electrode located adjacent the ceramic superconducting element for providing a third magnetic field to the ceramic superconducting element when a third electric current is applied therethrough; whereby when the first magnetic field is present, the ceramic superconducting element is made to establish a magneto-resistive state, when the first and second magnetic fields are present, when the first and third magnetic fields are present, the ceramic superconducting element is made to establish the superconductive state, and when the first, second and third magnetic fields are present, the ceramic superconducting element is made to establish the magneto-resistive state.

Furthermore, according to the present invention, a memory device comprises: a substrate; a ceramic superconducting element having magneto-resistive characteristics deposited on the substrate; first electrode located adjacent the ceramic superconducting element for providing to the ceramic superconducting element a magnetic field, which is greater than a threshold magnetic field, for making the ceramic superconductive element in a magneto-resistive state when an electric current is applied therethrough; second electrode having opposite ends connected, respectively, to opposite ends of the ceramic superconducting element to define a closed loop by the ceramic superconducting element and the second electrode; whereby when a first current is applied between a first portion of the second electrode adjacent one end of the ceramic superconducting element and a second portion of the second electrode adjacent another end of the ceramic superconducting element, the first current partly flows through the ceramic superconducting element and partly flows through the second electrode, and then when a second current is applied through the first electrode, the ceramic superconducting element exhibits a magneto-resistive state to permit the first current to mostly flow through the second electrode, and thereafter, when the first and second currents are cut off simultaneously, the first current is captured in the closed loop to store data.

The new phenomenon is explained below. Generally, the ceramic superconducting element shows a superconductive characteristics below a certain temperature, such as 77K, provided that no magnetic field is applied to the ceramic superconducting element. When magnetic field is applied to the ceramic superconducting element, but not greater than a threshold level H0, the ceramic superconducting element continues to show the superconductive characteristics, as shown in FIG. 1. Then, when the magnetic field applied to the superconducting element becomes equal to the threshold level H0, the superconducting element looses its superconductivity and suddenly shows magneto-resistance which increases at a high rate relative to the increase of the magnetic field. Thereafter, when the magnetic field is reduced to the threshold level H0, the magneto-resistance is also reduced to zero again showing the superconductive characteristics. The same phenomenon is observed when the magnetic field is increased in the opposite polarity, as shown in FIG. 1.

Since the resistance of the ceramic superconductive element is obtained by the application of magnetic field, the obtained resistance is referred to as a magneto-resistance, and such a phenomenon observed in the ceramic superconducting element is referred to as a superconducting magneto-resistance system.

The superconducting magneto-resistance system can be understood as follows. When the ceramic superconductive element receives a magnetic field greater than the threshold level H0, the superconducting state of the crystal grain boundaries of the ceramic superconductor are destroyed by the applied magnetic field so that the superconductor changes from a superconducting state to an electrical resistance state.

More specifically, when the ceramic superconducting element having crystal boundaries formed by the grains of a ceramic material is not receiving any magnetic field, the ceramic element shows no electrical resistance, as shown in FIG. 5. However, when a magnetic field greater than the threshold magnetic field H0 is applied, the ceramic element suddenly exhibits electrical resistance and the electrical resistance increases sharply as the applied magnetic field is increased. Since the rate of the change in resistance $\Delta R/\Delta H$ to at the threshold magnetic field H0 is as great as infinity, the logic device formed by the ceramic superconducting element utilizing superconducting magneto-resistance system will exhibit stable and high performance when compared with the conventional magneto-resistance elements.

The trend in research in ceramic superconducting devices as being advanced by many research organizations today seeks to improve critical temperature (Tc), threshold magnetic field (H0), and threshold current (Jc) characteristics. In the research carried by the present inventors in the ceramic superconducting devices, the above mentioned phenomenon was found in specific types of superconductors (those having a weak coupling state between the grains of the superconducting body). The phenomenon is such that the superconducting state of these weak couplings is destroyed by a weak magnetic field (several gauss) as shown in FIG. 5, and thus exhibit electrical resistance, and that this resistance increases sharply with the increase in the strength of the applied magnetic field. This invention proposes a ceramic superconducting device which operates as a new type of logic circuit device using this phenomenon of a weak critical magnetic field.

As shown in FIG. 2, the ceramic superconducting element comprises crystals of man superconducting fine grains in which an extremely thin insulator or resistor is interposed between the grains, but such grain boundaries exhibit zero electrical resistance, in which electrons move freely, due to the tunnel effect under the superconducting state. Or, the grains are contacted by a point. When juxtaposed grain boundaries exhibit a point contact in the so-called weak bond state, the superconductive state is obtained, and when a weak electrical field is applied, the point contacts are destroyed to exhibit ohmic resistance.

Stated otherwise, a polycrystalline ceramic superconducting body in a weak bond state can equivalently form a bonded body of multiple Josephson bonds 121, as shown in FIG. 2.

When a magnetic field is applied to a superconducting device of this type, the effects of the magnetic field break the superconducting state of Josephson bonds 121, specifically, the superconducting weak bond state is broken by the application of a weak magnetic field so that the device exhibits electrical resistance, and the strength of this electrical resistance increases as the strength of the magnetic field is increased.

As will be clear from this principle as described above, this property is not dependent upon the direction of the applied magnetic field because the arrangement of the crystal grain boundaries is random, but is determined by the absolute value of the strength of the magnetic field.

The present invention utilizes the weak bond existing at the crystal grain boundaries of a ceramic superconducting element. The device according to the present invention includes three conductive strips parallel or perpendicular to the superconducting device to provide a different levels of magnetic field to the ceramic superconducting element by the electric current flowing through these conductive strips so as to change the ceramic superconducting element between superconductive and magneto-resistive states.

In a preferred embodiment of the present invention, the ceramic superconducting element is made of $Y_1Ba_2Cu_3O_7-x$, $Bi_1Sr_1Ca_1Cu_2O_x$, or any other ceramic superconducting film, and is formed in an elongated pattern, The electrical current conducting strips are made parallel or perpendicular to the ceramic superconducting film.

In alternative embodiments of the aforementioned ceramic superconducting device, the three conductive strips which are provided on a single substrate, may be provided in a layered structure separated by an insulating material, or they may be juxtaposed with a parallel or perpendicular arrangement.

Furthermore, in a preferred embodiment according to the present invention, each conductive strip is coupled with an independent current source.

According to another embodiment, a superconductive memory device according to the present invention which achieves the above objectives is comprised of a superconductive loop formed in at least part by a ceramic superconductor having grain boundaries which are easily affected by a magnetic field, and controls the superconducting state of the ceramic superconductor having such grain boundaries by means of a magnetic field generated by current supplied to conductive strips provided near said ceramic superconductor for control.

In a superconductive memory device as described above, lead members for power supply and signal detection are provided at positions so as to sandwich the superconducting member having grain boundaries as described above. In a superconductive memory device of this type, a current is supplied to the conductive strips provided near the ceramic superconducting member to operate the magnetic field and perform write operations, which store magnetic flux in the superconducting loop, and read and erase operations, which release magnetic flux from the loop.

It has been previously reported in "Electronic Technology" (Volume 30, No. 2, published 1988, in Japanese) that the superconducting state of a ceramic superconductor can be broken by the application of a very weak magnetic field depending upon the state of the grain boundaries, that electrical resistance suddenly appears when the superconducting state is broken, and that this resistance increases rapidly when the magnetic field strength is increased. The present invention applies this characteristic to the switching member of a superconducting loop which operates as a memory device.

BRIEF DESCRIPTION OF THE DRAWINGS

These and other objects and features of the present invention will become apparent from the following description taken in conjunction with preferred embodiments thereof with reference to the accompanying drawings, throughout which like parts are designated by like reference numerals, and in which.

DETAILED DESCRIPTION OF THE PREFERRED EMBODIMENTS

Logic Device

Structure

Figure 1:
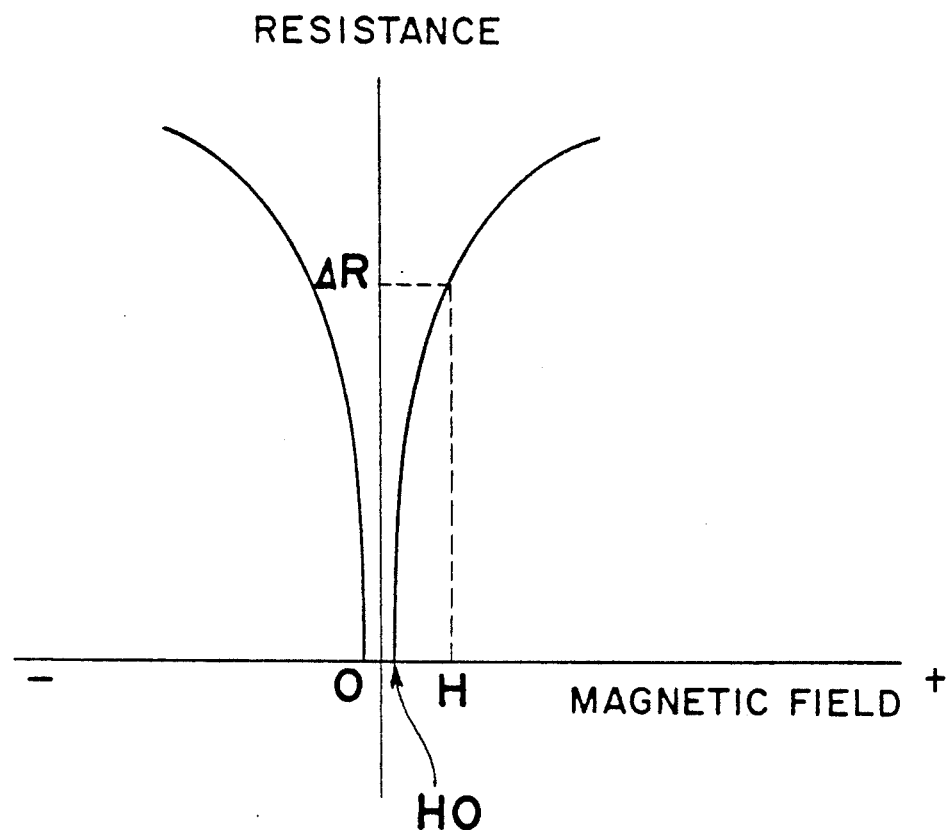
FIG. 1 is a graph showing the magneto-resistance change relative to the applied magnetic field strength in the ceramic superconducting element.
Figure 2:
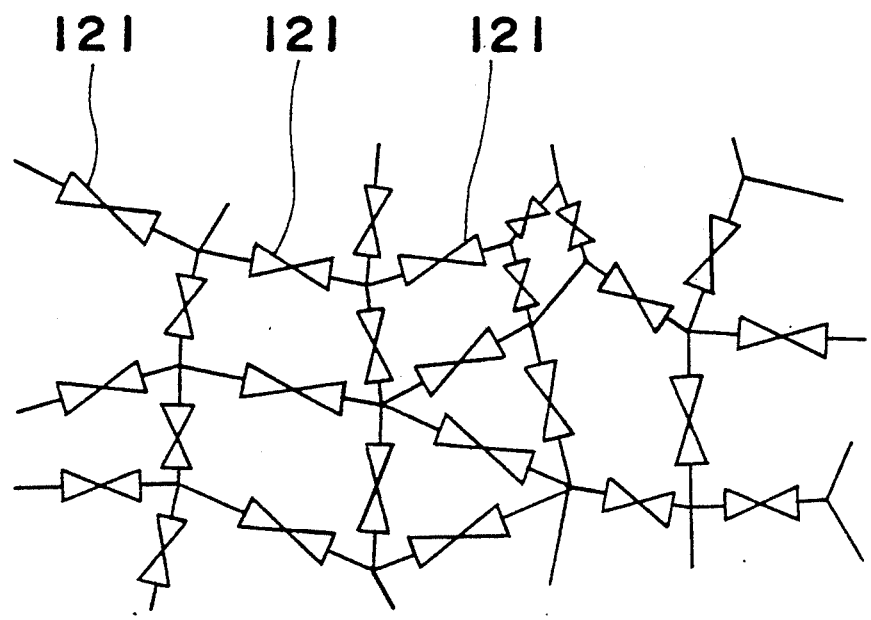
FIG. 2 is a diagrammatic view of electric conductive passages formed in the ceramic superconductive material.
Figure 3:
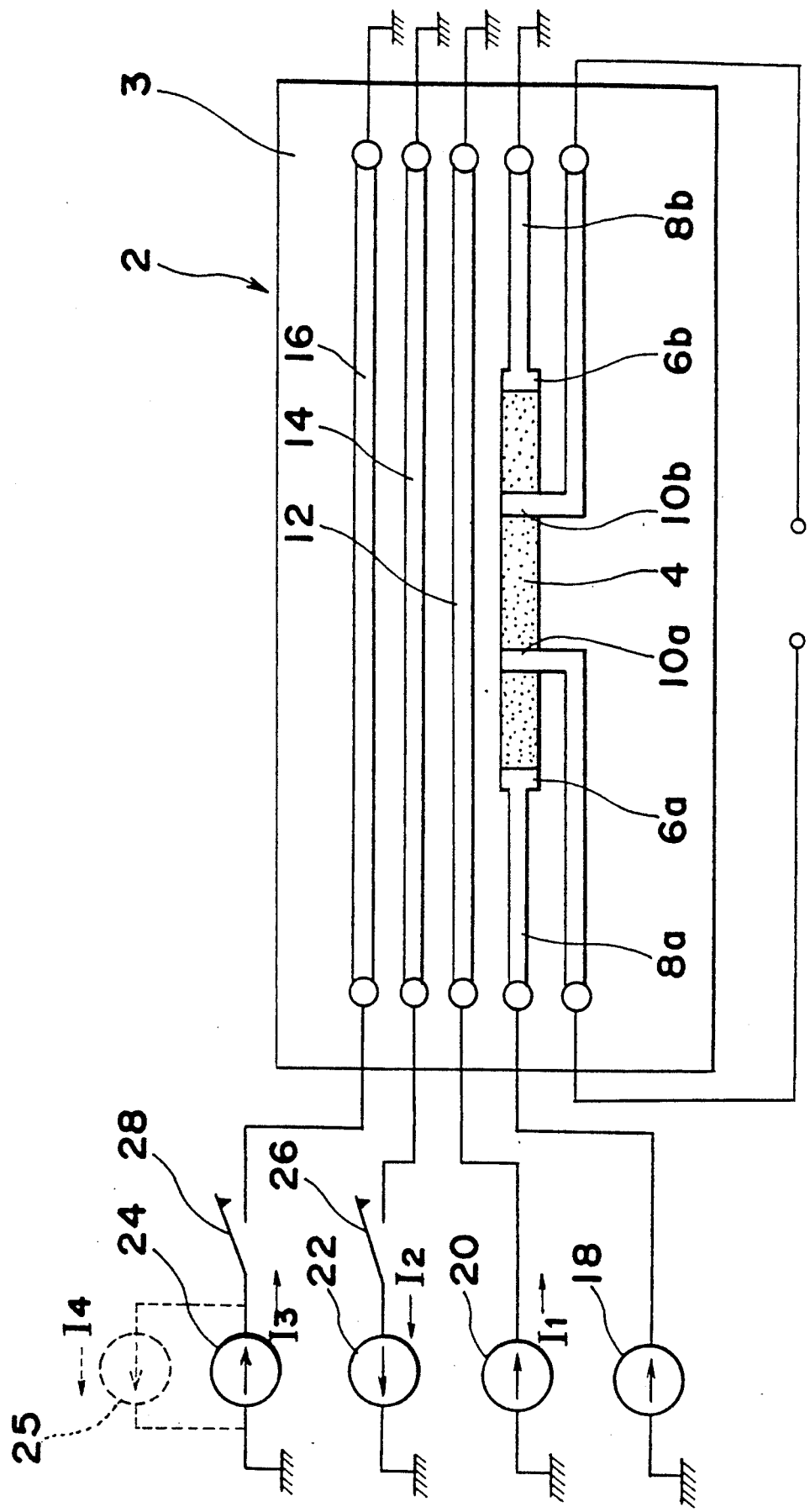
FIG. 3 is a diagrammatic view of a logic device employing a ceramic superconducting element according to a preferred embodiment of the present invention.

Referring to FIG. 3, a logic device employing a ceramic superconducting element according to a preferred embodiment of the present invention is shown.

In FIG. 3, reference number 2 is a logic device including a ceramic superconducting element 4 deposited on a substrate 3 and having an elongated configuration extending between current electrodes 6a and 6b. Current electrodes 6a and 6b are connected, respectively, with current supply electrodes 8a and 8b extending in opposite directions for supplying an electric current to flow through the ceramic superconducting element 4.

Connected intermediately along the ceramic superconducting element 4 are voltage electrodes 10a and 10b for obtaining a voltage drop between the connected points of the ceramic superconducting element 4.

Extending closely adjacent and parallel to the ceramic superconducting element 4 are three electrode strips 12, 14 and 16 for providing predetermined different levels of magnetic field in the ceramic superconducting element 4 by the control of electric current flowing through one, two or three of the three electrode strips.

Implication Logic

In order to perform the IMPLICATION logic by the logic device of FIG. 3, DC current sources 18, 20, 22 and 24 are connected, respectively, to electrodes 8a, 12, 14 and 16. DC current sources 18, 20 and 24 are provided to supply DC current in one direction, e.g., from left to right in FIG. 3, and current source 22 is provided to supply DC current in the opposite direction, e.g., from right to left. A switch 26 is inserted between current source 22 and electrode 14, and a switch 28 is inserted between current source 24 and electrode 16.

From current sources 20, 22 and 24, DC currents I1, −I2 and I3 can be supplied to electrodes 12, 14 and 16, respectively, provided that the current flowing from left to right in FIG. 3 is deemed as positive direction. By the currents I1, −I2 and I3, magnetic field having the strengths H1, −H2 and H3 are generated at the ceramic superconducting element 4.

Figure 4:
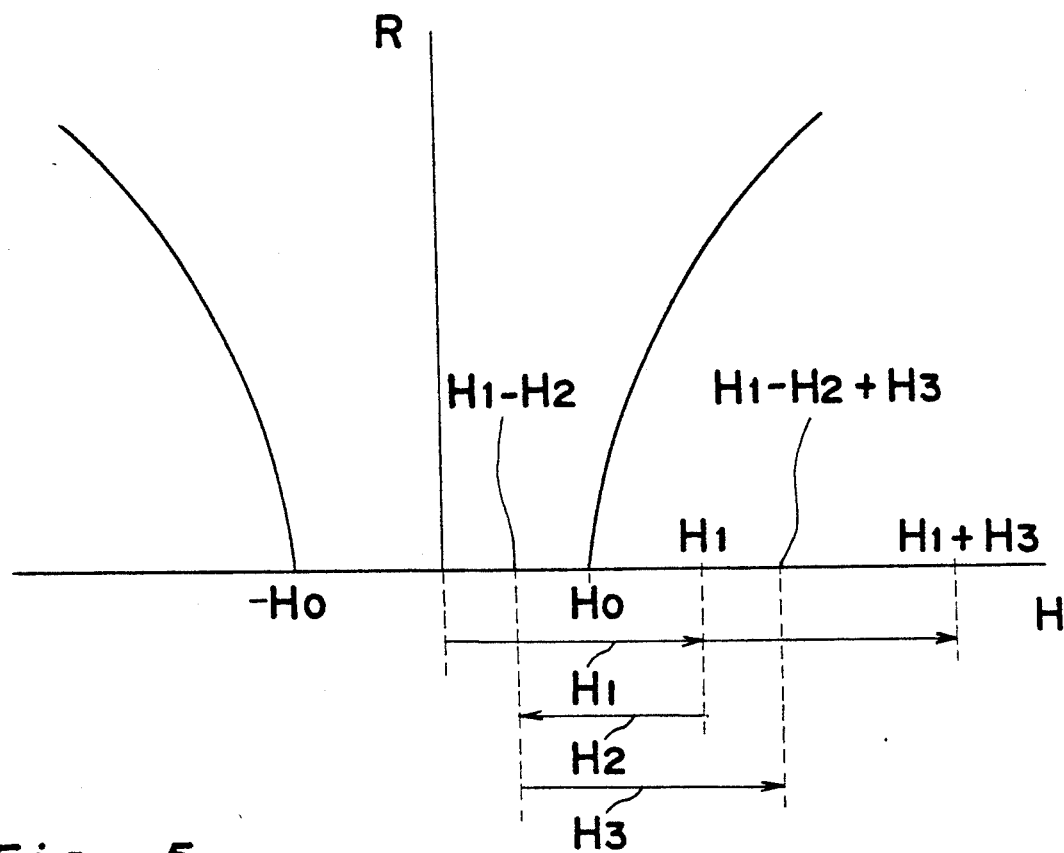
FIGS. 4 and 5 are a graph showing condition change of the ceramic superconducting element by the application of magnetic field for performing IMPLICATION logic and EQUIVALENCE logic, respectively.

Determined by various factors, such as distance between the ceramic superconducting element 4 and electrode 12 and amount of current flowing through electrode 12, the magnetic field strength H1 is selected to satisfy the following inequality:

$$H1 > H0 \quad (1a)$$

in which H0 is a threshold field strength of the ceramic superconducting element 4. As shown in FIG. 4, if the field strength in the ceramic superconducting element 4 is between −H0 and +H0, the ceramic superconducting element 4 maintain the superconductive state, and if the field strength in the ceramic superconducting element 4 increases greater than +H0 or decreases smaller than −H0, the ceramic superconducting element 4 exhibits magneto-resistive state. Thus, when switches 26 and 28 are turned off to provide only current I1, the ceramic superconducting element 4 receives magnetic field H1, making element 4 in the magneto-resistive state.

In a similar manner, the magnetic field strength H2 is selected to satisfy the following inequality:

$$|H1 - H2| < H0. \quad (1b)$$

Thus, when switch 26 is turned on and switch 28 is turned off to provide current −I2 in addition to current I1, the ceramic superconducting element 4 receives magnetic field H1-H2 which falls, as shown in FIG. 4, between −H0 and +H0, making element 4 in the superconductive state.

Furthermore, the magnetic field strength H3 is selected to satisfy the following inequality:

$$H1 - H2 + H3 > H0. \quad (1c)$$

Thus, when switches 26 and 28 are both turned on to provide currents −I2 and I3 in addition to current I1, the ceramic superconducting element 4 receives magnetic field H1−H2+H3 which is greater than the threshold field strength H0, as shown in FIG. 4, making element 4 in the magneto-resistive state.

Also, when switches 26 is turned off and switch 28 is turned on to provide current I3 in addition to current I1, the ceramic superconductive element 4 receives magnetic field H1+H3 which is greater than H0, as shown in FIG. 4, making element 4 in the magneto-resistive state.

If a current is applied to ceramic superconductive element 4 from DC current source 18 a voltage drop will be observed across element 4 between electrodes 10a and 10b when the ceramic superconductive element 4 is in the magneto-resistive state, but no voltage drop will be observed between electrodes 10a and 10b when the ceramic superconductive element 4 is in the superconductive state.

Accordingly, if the presence and absence of the current are indicated as "1" and "0", respectively, and the presence and absence of the voltage are also indicated as "1" and "0", respectively, the following Table C is obtained.

TABLE C

| Input Currents | | | Output Voltage |
| --- | --- | --- | --- |
| I1 | I2 | I3 | 10a–10b |
| 1 | 0 | 0 | 1 |
| 1 | 1 | 0 | 0 |
| 1 | 0 | 1 | 1 |
| 1 | 1 | 1 | 1 |

As will be understood from Table C, input currents I2 and I3 and output voltage between electrodes 10a and 10b correspond to the IMPLICATION logic.

It is to be noted that in order to meet the conditions of inequalities (1a), (1b) and (1c) indicated above, current sources 20, 22 and 24 may produce, for example, 10 mA, 25 mA and 40 mA for currents I1, −I2 and I3, respectively.

Equivalence Logic

In order to perform the EQUIVALENCE logic, DC current source 24 is replaced by a DC current source 25, shown by a dotted line in FIG. 3, which is provided to supply DC current from right to left when viewed in FIG. 3.

Thus, from current sources 20, 22 and 25, DC currents I1, −I2 and −I4 can be supplied to electrodes 12, 14 and 16, respectively, provided that the current flowing from left to right in FIG. 3 is deemed as positive direction. By the currents I1, −I2 and −I4, magnetic field having the strengths H1, −H2 and −H4 are generated at the ceramic superconducting element 4.

Similar to the above, the magnetic field strength H1 is selected to satisfy the following inequality:

$$H1 > H0 \quad (2a)$$

Figure 5:
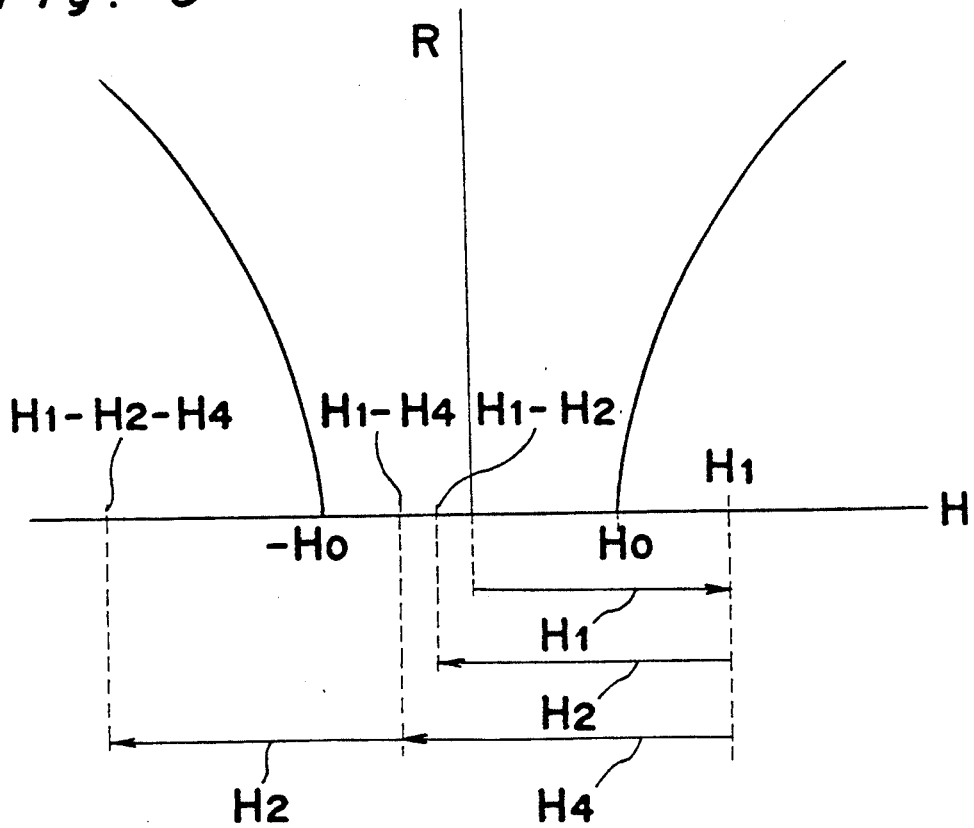

Thus, when switches 26 and 28 are turned off to provide only current I1, the ceramic superconducting element 4 receives magnetic field H1, making element 4 in the magneto-resistive state, as understood from FIG. 5.

The magnetic field strength H2 is selected to satisfy the following inequality:

$$|H1-H2| < H0. \qquad (2b)$$

Thus, when switch 26 is turned on and switch 28 is turned off to provide current −I2 in addition to current I1, the ceramic superconducting element 4 receives magnetic field H1−H2 which falls, as shown in FIG. 5, between −H0 and +H0, making element 4 in the superconductive state.

Furthermore, the magnetic field strength H4 is selected to satisfy the following inequality:

$$|H1-H2-H4| > H0. \qquad (2c)$$

Thus, when switches 26 and 28 are both turned on to provide currents −I2 and −I3 in addition to current I1, the ceramic superconducting element 4 receives magnetic field |H1−H2−H4| which is greater than the threshold field strength H0, as shown in FIG. 5, making element 4 in the magneto-resistive state.

Also, when switches 26 is turned off and switch 28 is turned of to provide current −I3 in addition to current I1, the ceramic superconductive element 4 receives magnetic field H1−H4 which falls, as shown in FIG. 5, between −H0 and +H0, making element 4 in the superconductive state.

Accordingly, the following Table D is obtained, provided that the presence and absence of the current are indicated as "1" and "0", respectively, and the presence and absence of the voltage are also indicated as "1" and "0", respectively.

TABLE D

| Input Currents | | | Output Voltage |
| --- | --- | --- | --- |
| I1 | I2 | I3 | 10a−10b |
| 1 | 0 | 0 | 1 |
| 1 | 1 | 0 | 0 |
| 1 | 0 | 1 | 0 |
| 1 | 1 | 1 | 1 |

As will be understood from Table D, input currents I2 and I3 and output voltage between electrodes 10a and 10b correspond to the EQUIVALENCE logic.

It is to be noted that in order to meet the conditions of inequalities (2a), (2b) and (2c) indicated above, current sources 20, 22 and 25 may produce, for example, 10 mA, 25 mA and 40 mA for currents I1, −I2 and −I4, respectively.

METHOD FOR MAKING THE LOGIC DEVICE

Figure 6:
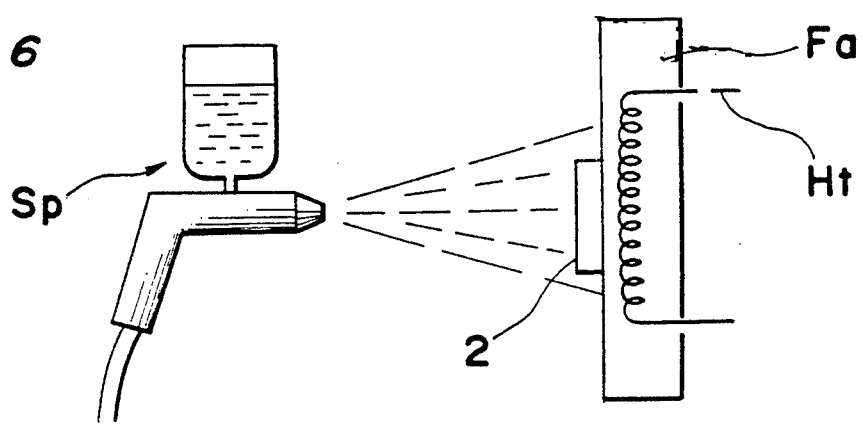
FIG. 6 is a diagrammatic view showing a method for making the ceramic superconductive element on a substrate.

In order to manufacture a ceramic superconducting device 2 of the type used in the present invention, a substrate 3 made of stabilized zirconia is heated by a heater Ht provided in a film forming apparatus Fa as shown in FIG. 6 to maintain a substrate temperature of 400° C. The ceramic material is a mixture of $Y(NO_3)_3 \cdot 6H_2O$, $Ba(NO_3)_2$, and $Cu(NO_3)_2 \cdot 3H_2O$ weighed to form $Y_1Ba_2Cu_3O_7-x$, mixed in a nitrate solution which is sprayed intermittently by air sprayer Sp onto substrate 3 so as to form a film having a thickness of 5 μm. Thus, a spray pyrolysis method may be used. The substrate and film are then baked at 950° C. for 60 minutes and thereafter annealed in air for 10 hours at 500° C. Regarding the critical temperature of a ceramic superconducting film thus formed, resistance begins to drop from 100K, and loses all resistance at 83K.

Next, in order to process the high temperature ceramic superconducting film to a 50 μm wide, 30 mm long superconducting body 4, the substrate 3 is applied with a photoresist and processed with conventional photolithography processes to form a fine striped shape, thus forming the superconducting element 4 on substrate 3. This ceramic high temperature superconducting element can be easily processed in a phosphoric acid etching agent.

Next, in order to manufacture the electrodes 6a, 6b, 8a, 8b, 10a, 10b, 12, 14 and 16, a pattern is formed by Ti deposition film by the photolithographic processes and a lift-off technique and the ceramic superconducting device as shown in FIG. 3 is prepared.

Figure 7:
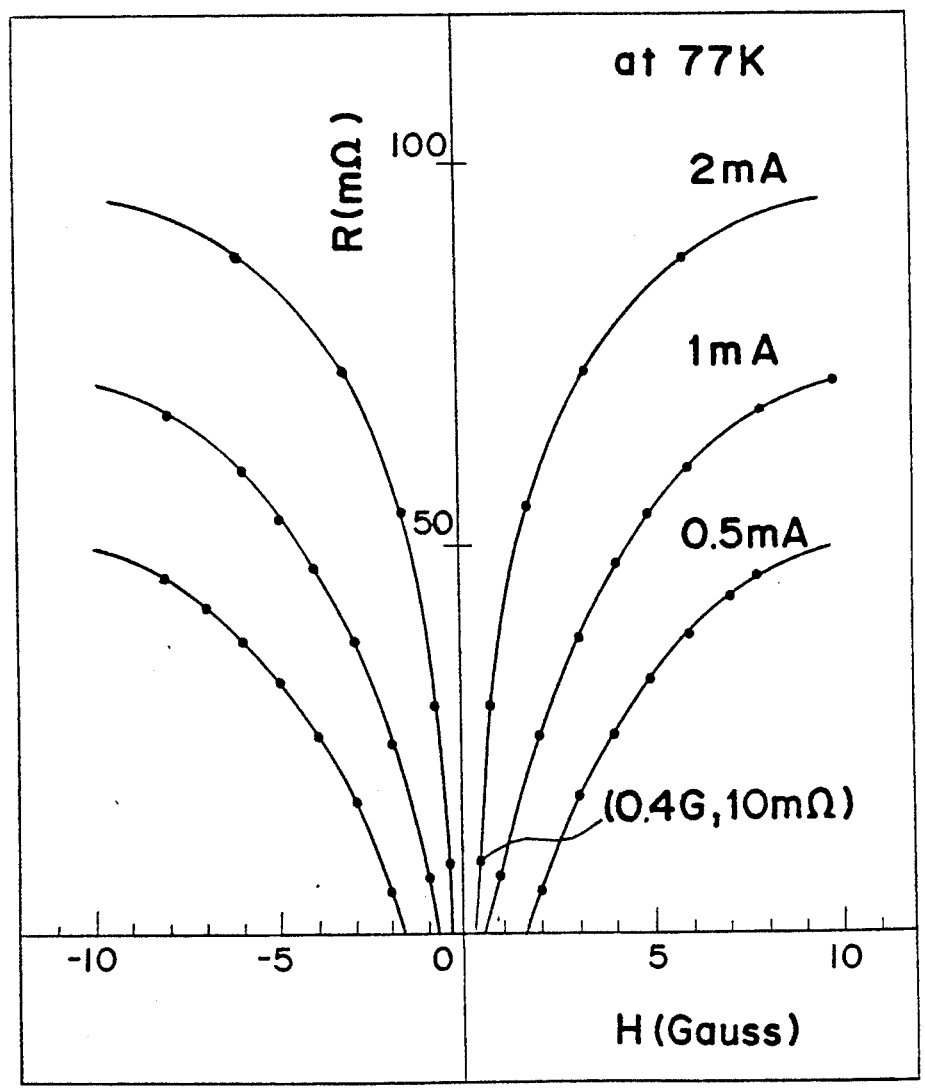
FIG. 7 is a graph showing the magneto-resistance change relative to the applied magnetic field strength in the ceramic superconducting element for different electric currents applied to the ceramic superconducting element.

The ceramic superconducting device 2 used in the present invention forms weak couplings due to the point contacts and insulating layer interposed between the grain boundaries, and may be thought of as an aggregation of Josephson junctions. Regarding the relationship between the applied magnetic field and electrical resistance shown in FIG. 7, magneto-resistance suddenly appears and increases rapidly when the strength of the magnetic field applied to the ceramic superconducting element, which has been in the superconductive state, exceeds a threshold level. Such a threshold level varies depending on the current flowing through the ceramic superconducting element.

On the other hand, when a 10 mA current is supplied to electrode 12, formed of a Ti film, a magnetic field of 0.4 gauss can be obtained at a distance of 50 μm. Therefore, as apparent from the characteristics of the superconducting material shown in FIG. 7, when a 2 mA constant current is supplied to the superconducting element 4 through terminals 6a and 6b while receiving the 0.4 gauss magnetic field, the superconducting element will show 10 mΩ and thus, a 20 μV (10 mΩ×2 mA) output can be obtained.

According to one preferred embodiment, the ceramic superconducting device 2 shown in FIG. 3 has such a arrangement that the center to center distance between electrodes 16 and 14, between electrodes 14 and 12, between electrode 12 and ceramic superconducting element 4 is 50 μm, and the width of each of electrodes 12, 14 and 16 is 30 μm, and the width of ceramic superconducting element 4 is 50 μm.

When the ceramic superconducting device 2 of the above described construction is cooled to a temperature lower than 83K, and if no current is supplied to electrodes 12, 14 and 16 to provide no magnetic field at the ceramic superconductive element 4, an output voltage will not appear between electrodes 10a and 10b even when a current is supplied to ceramic superconducting element 4 via electrodes 8a and 8b, because in this case element 4 is maintained in the superconductive state. However, if a 10-mA current I1 is supplied to electrode 12 from current source 20, the magnetic field created by this current destroys the superconductive state of element 4, and produces magneto-resistance. Thus, a 20 μV output is obtained between electrodes 10a and 10b when a constant current 2 mA is supplied through element 4.

It is to be noted that, according to the present invention as described above, the values of currents I1, I2, and I3 and the arrangement of electrodes 12, 14, 16 and element 4 are not limited to those described above, but they may take any other amounts and sizes. For example, it is possible that currents I1, I2, and I3 supplied to electrodes 12, 14 and 16 may be made constant and equal to each other, and that electrodes 12, 14 and 16 may be so spaced as to satisfy inequalities (1a), (1b) and (1c) or inequalities (2a), (2b) and (2c).

In addition, the method for making electrodes 12, 14 and 16 and superconducting element 4 as described above should not be limited to the process as described above, but other processes, such as sputtering, MOCVD, or electron beam evaporation techniques may be used, as long as the same effects can be obtained. In particular, electrodes 12, 14 and 16 may be formed by a superconducting thin film, and in such a case, they may be formed at the same time as superconducting element 4 is made, thereby simplifying the manufacturing process.

Moreover, as apparent to those skilled in the art, while the ceramic high temperature superconducting film used in the present invention is $Y_1Ba_2Cu_3O_7-x$, the same effect may be obtained by using other high temperature superconductors as long as the grain boundaries form a weak coupling.

Figure 8:
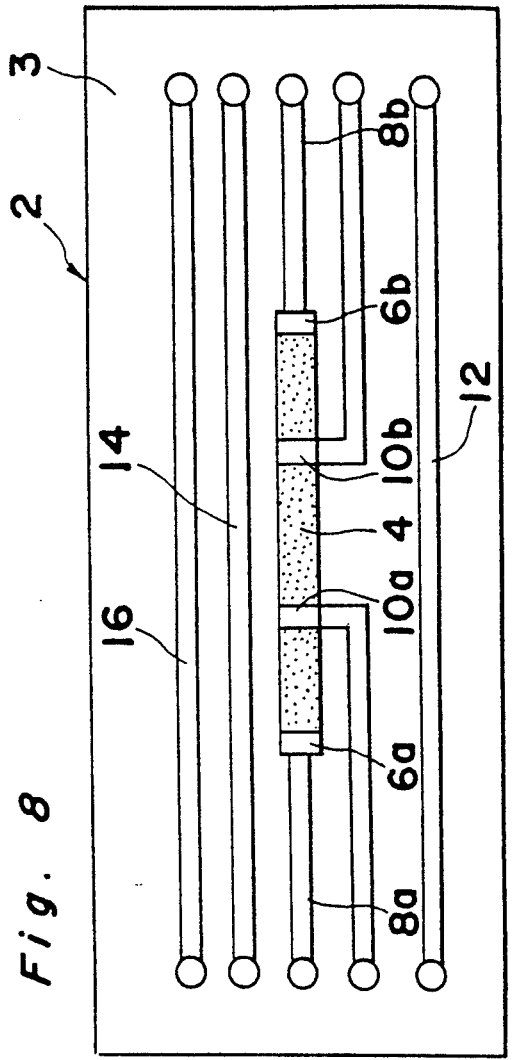
FIG. 8 is a view similar to FIG. 3, but showing a modification thereof.

Furthermore, the relationship of the positions of superconducting element 4 and electrodes 12, 14 and 16 shall not be limited to that described above with respect to the present embodiment. For example, one of the electrodes, such as electrode 12, may be formed on the opposite side of superconducting body 4, as shown in FIG. 8. Moreover, the same effect may be obtained if electrodes 12, 14 and 16 are formed one over the other with an insulation layer of $SiO_2$ or a polyimide resin inserted therebetween.

Figure 9A:
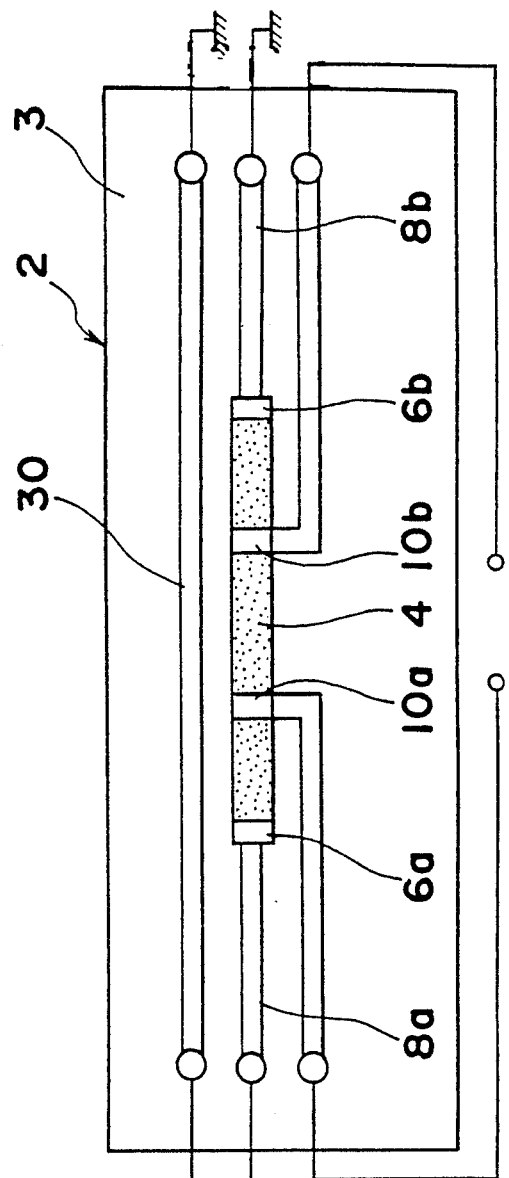
FIGS. 9a and 9b are views similar to FIG. 3, but showing further modifications thereof.
Figure 9A:
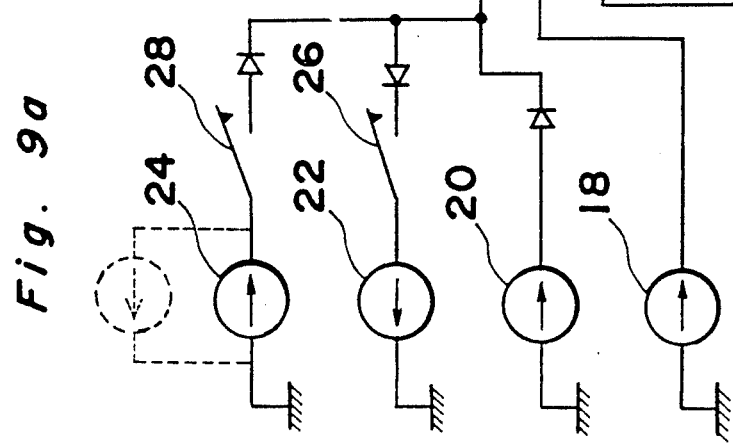
Figure 9B:
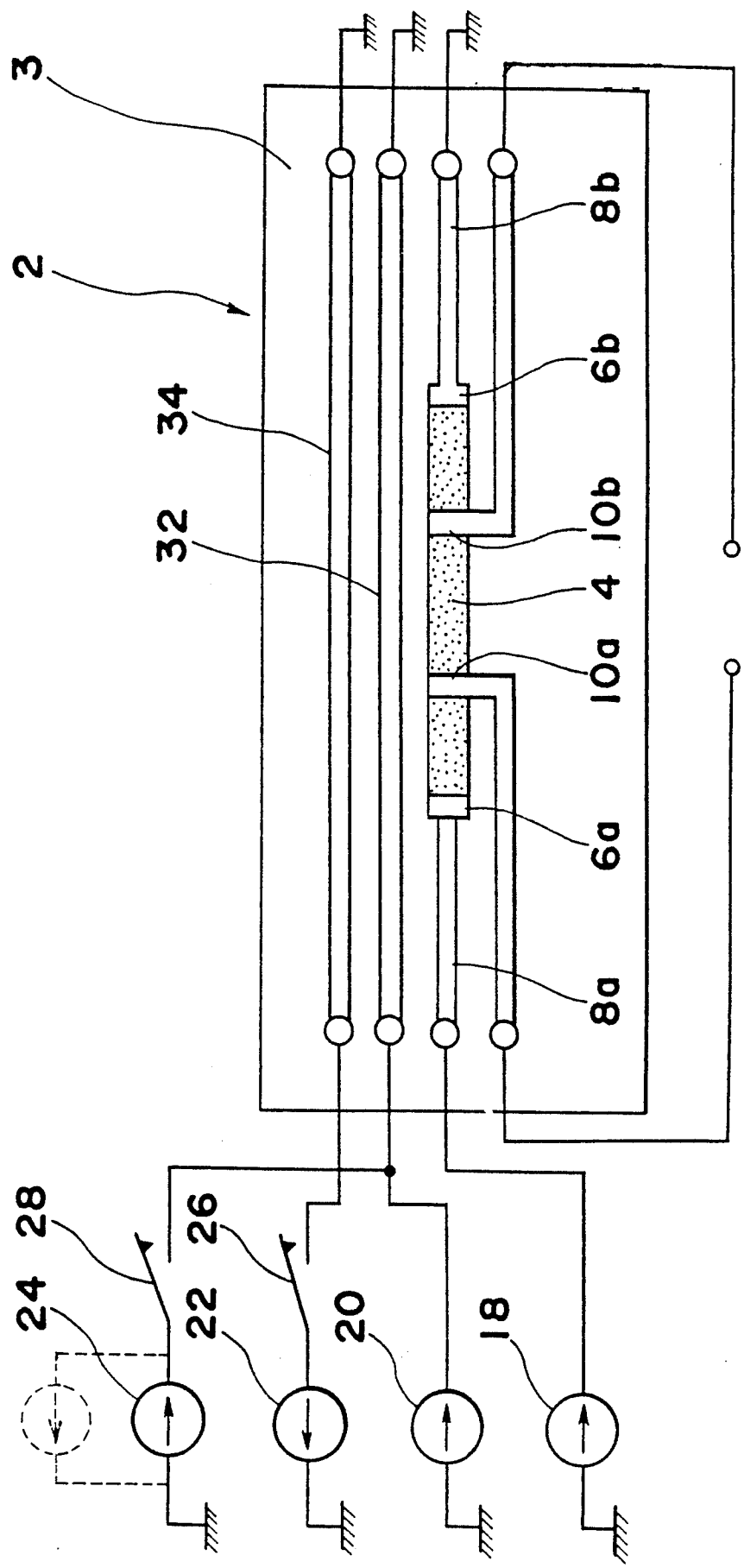

Also, as shown in FIG. 9a, only one electrode 30 may be provided to receive currents from different current sources 20, 22 and 24. In this case, suitable diodes are provided to prevent currents to flow back to the current source. Alternatively, as shown in FIG. 9b, one electrode 32 is provided for receiving currents in one direction and another electrode 34 is provided for receiving currents in other direction.

MEMORY DEVICE

Structure

Figure 10:
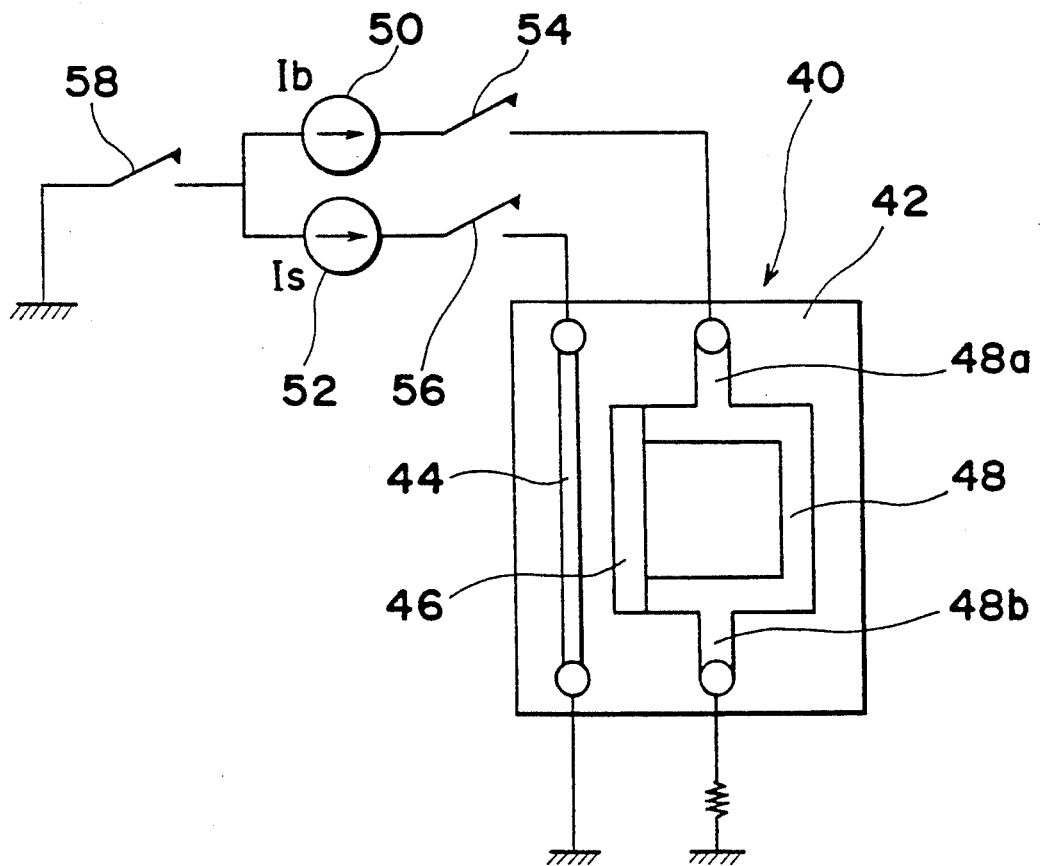
FIG. 10 is a diagrammatic view of a memory device employing a ceramic superconducting element according to a preferred embodiment of the present invention.

Referring to FIG. 10, a ceramic superconducting memory device 40 comprises a substrate 42 on which an electrode 44 is deposited. A ceramic superconducting element 46 is deposited parallel and adjacent electrode 44. Opposite ends of the ceramic superconductive element 46 are electrically connected with U-shaped electrode 48 so that, element 46 and electrode 48 together form a rectangular closed loop. Projecting electrodes 48a and 48b are provided adjacent opposite ends of ceramic superconducting element 46. According to the preferred embodiment, electrode 48 is also made of a superconducting element, but which will maintain the superconductive state even when the magnetic field is applied.

Electrode 44 is connected through a switch 56 to a current source 52 which supplies a current IS, and projecting electrode 48a is connected through a switch 54 to a current source 50 which supplied a current Ib. Current sources 50 and 52 are connected to each other and are switched by a single switch 58.

In operation, first, the ceramic superconducting memory device 40 is kept in such a condition that ceramic superconducting element 46 is in the superconductive state. Then, switch 58 is turned on with switches 54 and 56 being turned off and, thereafter, switch 54 is turned on to provide current between projecting electrodes 48a and 48b. Thus, as shown in FIG. 11a, current ½Ib flows through ceramic superconducting element 46 and approximately the same current ½Ib flows through electrode 48.

Thereafter, when switch 56 is turned on, current Is flows through electrode 44 to provide magnetic field at the ceramic superconducting element 46 which is greater than the threshold magnetic field H0. Thus, a magneto-resistance is produced in the ceramic superconducting element 46 to prevent electric current to flow through the ceramic superconducting element 46. Thus, as shown in FIG. 11b, current Ib flows mostly through electrode 48.

Thereafter, when switch 58 is turned off, current sources 50 and 52 are disabled simultaneously. Thus, no current flows through electrode 44 to produce no magnetic field, resulting in reestablishment of superconductive state in the ceramic superconducting element 46. Also, no current is supplied to electrode 48. Accordingly, the current Ib which has been flowing through electrode 48 is captured and circulates in the closed loop defined by electrode 48 and ceramic superconducting element 46, as shown in FIG. 11c.

Figures 11A, 11B, 11C:
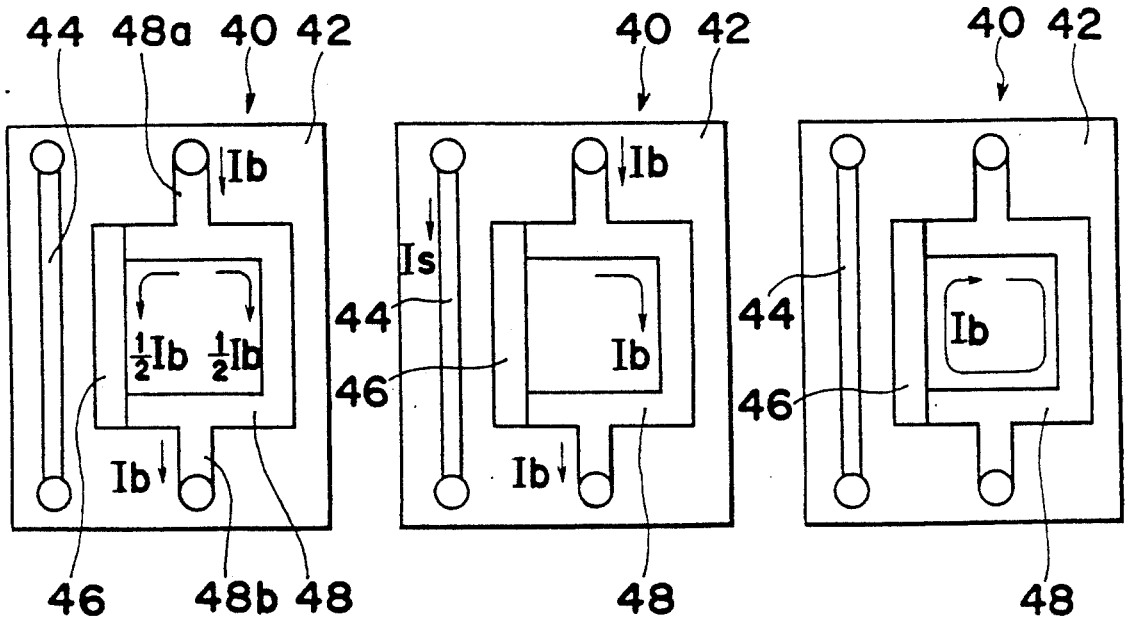
FIGS. 11a, 11b and 11c are diagrammatic views showing electric current flowing through the memory device of FIG. 10.

When the current is captured in the closed loop as shown in FIG. 11c, it is apparent that data, such as "1", is stored in the closed loop, and can be held in the closed loop without requiring electrical power. The memory can be cleared by turning the switch 58 on to provide at least current Is to electrode 44 to make the ceramic superconducting element 46 to magneto-resistive state to interrupt the circulating current in the loop.

According to the preferred embodiment, the center to center distance between electrode 44 and the ceramic superconducting element 46 is 50 μm and the width of electrode 44 and element 46 is made 30 μm and 50 μm, respectively. The loop is made approximately square, and the distance of one circulation along the loop is approximately 300 μm. When current Is flowing through electrode 44 is made approximately a 10 mA, a 0.4 gauss magnetic field is applied at the ceramic superconductive element 46. Under this condition, if a 2 mA (=½Ib) current is supplied to the ceramic superconductive element 46, a resistance of 10 mΩ will be produced in element 46.

In a specific example, Ib is made equal to 4 mA, and the superconductive memory device is cooled in liquid nitrogen to 77K. When the ceramic superconductive element 46 is in the superconductive state, approximately one-half, i.e., 2 mA, flows through element 46 and electrode 48. When Is is made equal to 10 mA, a magnetic field of approximately 0.4 gauss is applied to the ceramic superconducting element 46 which is spaced approximately 50 μm away, thus producing a magneto-resistance in element 46. When the current is captured in the closed loop by turning switch 58 off, a permanent current of approximately 4 mA flows through the closed loop so that magnetic flux is produced from the loop for the establishment of a "write" state of a memory device. The two reasons which can be given for the permanent current within the loop are that the time taken for the superconducting element 46 to recover to the superconductive state is less than the time required for the electrons to flow through the superconducting loop, and that the impedance which determines the flow of the electrons is less inside the loop than in the direction of the power supply. The written data is maintained as long as the permanent current flows through the closed loop.

Reading from the memory element which has been written to can be accomplished by the supply of current through electrode 48 in the reverse direction of that used to write to the superconducting loop, so that the current in part of the superconducting element 46 becomes greater than a threshold current Ic, or by a process of destructive reading in which a current is supplied to electrode 44 so that a magnetic field greater than threshold magnetic field H0 is applied to the ceramic superconducting element 46, resulting in such that the resistance resulting from the application of the current kills the permanent current, whereby a pulse voltage is generated at this moment of transition. Such a pulse voltage is used for reading.

To change from the write state to the erase state, resistance simply needs to be produced in superconductive element 46 in the above method.

In the embodiment described above, the superconducting members 46 and 48 may be formed by means of a ceramic superconducting thin film produced by sputtering, MOCVD, or electron beam evaporation, and the threshold current Ic and threshold magnetic field H0 may be lowered by providing a finer pattern of the electrode stem portions. In addition, superconducting members 46 and 48 may also be produced in separate processes. Also, if the line width is adjusted, electrode 44, as well as superconducting members 46 and 48, may be formed from the same superconductive film.

Figure 12A:
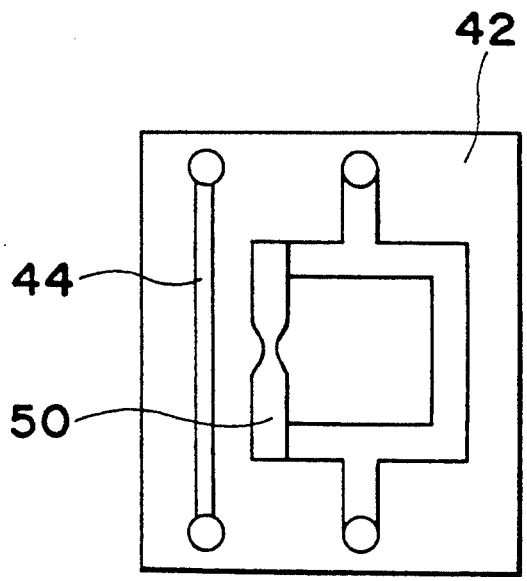
FIGS. 12a, 12b, 12c and 12d are views similar to FIG. 10, but showing modifications thereof.

Referring to FIG. 12a, a first modification of the superconducting memory device is shown in which a necked member may be provided in superconducting element 50 to increase the current density in this element and thereby increasing the sensitivity to the magnetic field.

Figure 12B:
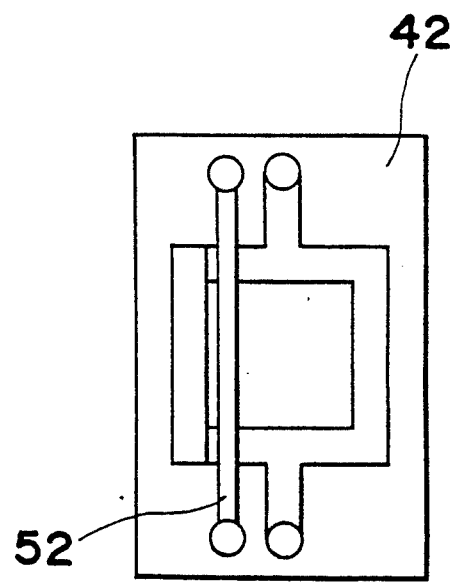

Referring to FIG. 12b, a second modification is shown in which the electrode 52 for supplying current Is intercepts the electrode 48 with a suitable insulation layer, such as SiO2 or an organic insulation layer such as a polyimide resin, provided therebetween. By this structure, an area for making the device can be reduced.

Figure 12C:
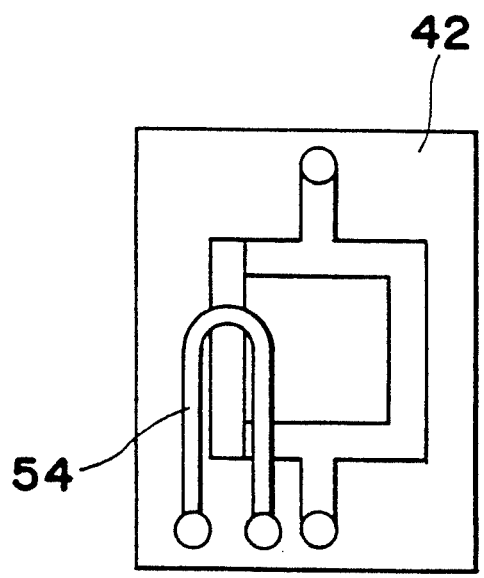
Figure 12D:
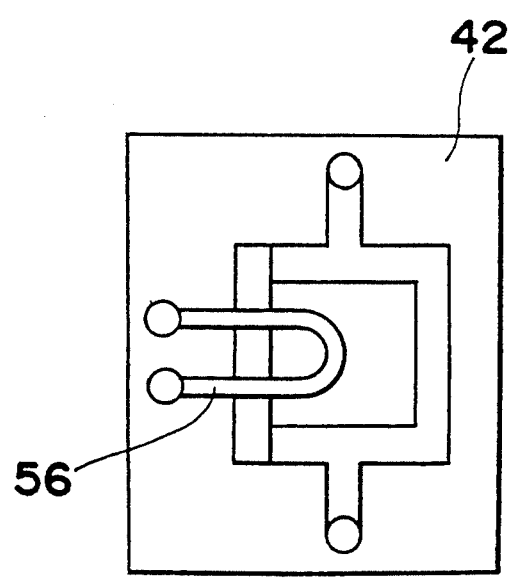

Referring to FIGS. 12c, and 12d, other possible modifications are shown so as to efficiently apply the magnetic field.

In addition, it is necessary that the ceramic superconducting element 46 forming the superconducting loop should be composed of a ceramic superconducting element having grain boundaries with a high magnetic sensitivity; other parts may be comprised of any other superconductive material, such as a superconducting layer with a high H0 and not having the grain boundaries with a weak coupling, or may be a lamination of these layers. In addition, if the loop is virtually formed by those parts normally in a superconducting state, writing can be made more certain by shortening the superconducting part controlled by the magnetic field, or by positioning the power supply projection electrodes 48a and 48b close to the vertically extending portion of the superconducting electrode 48, because when the data is written, the superconducting part produces the magnetic flux stored in the loop.

Reading method is not limited to the destructive read method described above, but other methods may be used, such as an optical reading method in which a magneto-optical effect film is used, or a fine magnetic sensor matrix may also be used.

The present invention uses the properties of superconductivity, but does not use Josephson devices which use extremely thin insulation films which are extremely difficult to manufacture by conventional methods. Thus, the ceramic superconductive devices according to the present invention, which uses the weak coupling magneto-resistive effects of a superconducting element formed easily in the grain boundaries of a ceramic superconducting element, can be easily manufactured. Thus, the devices according to the present invention provide good noise resistance with a practical power supply for both input and output, offers handling which is not difficult.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An IMPLICATION logic device comprising:
   a substrate;
   only a single ceramic superconducting element having magneto-resistive characteristics deposited on said substrate;
   a first electrode located adjacent said ceramic superconducting element for providing a first magnetic field to said ceramic superconducting element when a first electric current is applied therethrough;
   a second electrode located adjacent said ceramic superconducting element for providing a second magnetic field to said ceramic superconducting element when a second electric current is applied therethrough;
   a third electrode located adjacent said ceramic superconducting element for providing a third magnetic field to said ceramic superconducting element when a third electric current is applied therethrough;
   said first, second and third electrode having all their portions being located substantially in the same horizontal plane and being substantially parallel to each other and to said ceramic superconducting element along their lengths,
   whereby when said first magnetic field is present, said ceramic superconducting element is made to establish a magneto-resistive state, and when said first, second and third magnetic fields are present, said ceramic superconducting element is made to establish said magneto-resistive state.

2. An IMPLICATION logic device as claimed in claim 1, further comprising:
   a first current source for supplying said first electric current to said first electrode;
   a second current source for supplying said second electric current to said second electrode through a first switching means; and
   a third current source for supplying said third electric current to said third electrode through a second switching means.

3. An IMPLICATION logic device as claimed in claim 1, further comprising:
   a fourth current source for supplying a predetermined electric current to said ceramic superconducting element for producing a voltage across said ceramic superconducting element when said magneto-resistive state is established.

4. The implication logic device of claim 1 wherein said ceramic superconducting element includes grains of superconducting materials weakly coupled together.

5. An EQUIVALENCE logic device comprising:
   a substrate;
   a single ceramic superconducting element having magneto-resistive characteristics deposited on said substrate;
   a first electrode located adjacent said ceramic superconducting element for providing a first magnetic field to said ceramic superconducting element when a first electric current is applied therethrough;
   a second electrode located adjacent said ceramic superconducting element for providing a second magnetic field to said ceramic superconducting element when a second electric current is applied therethrough;
   a third electrode located adjacent said ceramic superconducting element for providing a third magnetic field to said ceramic superconducting element when a third electric current is applied therethrough;
   all portions of said first and third electrodes being substantially in the same horizontal plane and substantially parallel to each other and the superconducting element along their lengths;
   whereby when said first magnetic field is present, said ceramic superconducting element is made to establish a magneto-resistive state, when said first and second magnetic fields are present, when said first and third magnetic fields are present, said ceramic superconducting element is made to establish said superconductive state, and when said first, second and third magnetic fields are present, said ceramic superconducting element is made to establish said magneto-resistive state.

6. An EQUIVALENCE logic device as claimed in claim 5, further comprising:
   a first current source for supplying said first electric current to said first electrode;
   a second current source for supplying said second electric current to said second electrode through a first switching means; and
   a third current source for supplying said third electric current to said third electrode through a second switching means.

7. An EQUIVALENCE logic device as claimed in claim 5, further comprising:
   a fourth current source for supplying a predetermined electric current to said ceramic superconducting element for producing a voltage across said ceramic superconducting element when said magneto-resistive state is established.

8. The equivalence logic device of claim 5 wherein said ceramic superconducting element includes grains of superconducting material weakly coupled together.

9. A memory device which includes a ceramic superconductive element having grain boundaries that functions as a memory device without the tunnel requirements of a thin insulating film sandwiched between superconductors comprising:
   a superconducting loop at least one portion thereof being formed by a ceramic superconducting element having grain boundaries said superconducting loop being substantially in a single plane; and
   an electrode provided in approximation to said ceramic superconducting element said electrode being substantially linear and substantially in the same plane as the superconducting loop.

10. A memory device comprising:
    a substrate;
    a ceramic superconducting element having magneto-resistive characteristics deposited on said substrate;
    a first electrode located adjacent said ceramic superconducting element for providing to said ceramic superconducting element a magnetic field, which is greater than a threshold magnetic field, for making said ceramic; superconductive element in a magneto-resistive state when an electric current is applied therethrough;
    second electrode having opposite ends connected, respectively, to opposite ends of said ceramic superconducting element to define a closed loop by said ceramic superconducting element and said second electrode;
    said ceramic superconducting element and said first and second electrodes all being located in substantially the same plane.
    whereby when a first current is applied between a first portion of said second electrode adjacent one end of said ceramic superconducting element and a second portion of said second electrode adjacent another end of said ceramic superconducting element, said first current partly flows through said ceramic superconducting element and partly flows through said second electrode, and then, when a second current is applied through said first electrode, said ceramic superconducting element exhibits a magneto-resistive state to permit said first current to mostly flow through said second electrode, and thereafter, when first and second currents are cut off simultaneously, said first current is captured in said closed loop to store data.

11. The memory device of claim 10 wherein said ceramic superconducting element includes grains of superconduting material weakly coupled together.

12. A memory device as claimed in claim 10, further comprising:
    a first current source connected to said second electrode through a first switch means for providing said first current;
    a second current source connected to said first electrode through a second switch means for providing said second current; and
    a disabling means for disabling said first and second current sources, simultaneously.

* * * * *